(12) United States Patent
Kaneko

(10) Patent No.: US 7,652,327 B2
(45) Date of Patent: Jan. 26, 2010

(54) SEMICONDUCTOR DEVICE AND MANUFACTURING METHOD FOR SEMICONDUCTOR DEVICE

(75) Inventor: Atsushi Kaneko, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 381 days.

(21) Appl. No.: 11/365,871

(22) Filed: Mar. 2, 2006

(65) Prior Publication Data

US 2006/0208314 A1 Sep. 21, 2006

(30) Foreign Application Priority Data

Mar. 15, 2005 (JP) ............................. 2005-072600

(51) Int. Cl.
*H01L 29/94* (2006.01)
(52) U.S. Cl. .................. 257/330; 257/329; 257/333; 257/E29.257; 257/E29.26
(58) Field of Classification Search ......... 257/328–330, 257/332, 333, 339, 340, E29.131, E29.256, 257/E29.257, E29.26
See application file for complete search history.

(56) References Cited

U.S. PATENT DOCUMENTS

| | | | | |
|---|---|---|---|---|
| 5,796,125 A | * | 8/1998 | Matsudai et al. | ............ 257/141 |
| 5,894,149 A | * | 4/1999 | Uenishi et al. | ............ 257/331 |
| 6,673,681 B2 | * | 1/2004 | Kocon et al. | ............ 438/270 |
| 7,118,971 B2 | * | 10/2006 | Chang et al. | ............ 438/270 |

FOREIGN PATENT DOCUMENTS

JP 2004-31963 1/2004

* cited by examiner

*Primary Examiner*—Matthew E Warren
(74) *Attorney, Agent, or Firm*—Young & Thompson

(57) ABSTRACT

To provide a semiconductor device capable of reducing a gate capacitance, and preventing breakdown of a gate oxide film if a large amount of current flows. A semiconductor device according to an embodiment of the present invention includes: an epitaxial layer; a channel region formed on the epitaxial layer; a trench extending from a surface of the channel region to the epitaxial layer; a gate oxide film that covers an inner surface of the trench; a gate electrode filled into the trench; and a buried insulating film formed below the gate electrode and away from the gate oxide film.

12 Claims, 8 Drawing Sheets

RELATED ART

RELATED ART

SEMICONDUCTOR DEVICE AND MANUFACTURING METHOD FOR SEMICONDUCTOR DEVICE

BACKGROUND OF THE INVENTION

1. Field of the Invention

The present invention relates to a semiconductor device and a manufacturing method for the same. In particular, the invention relates to a semiconductor device having a trench gate, and a manufacturing method for the same.

2. Description of Related Art

Up to now, a vertical power MOSFET (Metal-Oxide Semiconductor Field Effect Transistor) has been known as a high-voltage MOSFET. In a trench-gate type MOSFET typifying such a power MOSFET, a gate electrode is provided inside a trench, and a channel region is formed in a vertical direction to easily shrink a cell pitch and realize a high degree of integration and a low on-resistance. However, a trench type MOSFET has a large gate capacitance (parasitic capacitance of a gate bottom portion), which leads to a great obstacle to the application to a high-speed switching element. Further, when a large amount of current (overcurrent) flows through the MOSFET, charges are concentrated around corners of the trench bottom, and a gate oxide film easily breaks. Accordingly, there is an increasing demand to reduce a gate capacitance and provide the gate oxide film from breaking due to the charge concentration.

As conventional trench-gate type MOSFETs, for example, a semiconductor device disclosed in Japanese Unexamined Patent Application Publication No. 2004-31963 has been known. In the MOSFET disclosed in Japanese Unexamined Patent Application Publication No. 2004-31963, a gate oxide film is formed with a large thickness at the trench bottom to reduce a gate capacitance.

FIGS. 8A to 8C show a manufacturing method for the conventional semiconductor device disclosed in Japanese Unexamined Patent Application Publication No. 2004-31963. In particular, FIGS. 8A to 8C show a method of forming a gate oxide film inside the trench. First, an epitaxial layer 213 is formed on a silicon substrate 211, and formation of a trench 203a proceeds from the front surface side of the epitaxial layer 213. As shown in FIG. 8A, a mask 801 is formed so as to expose an opening of the trench 203a, and impurities such as As (arsenic) are injected to the bottom of the trench 203a. As shown in FIG. 8B, a high-concentration region 802 is then formed below the trench 203a As a result of heat treatment, as shown in FIG. 8C, a gate oxide film 204 is formed inside the trench 203a. At this time, an impurity concentration differs between a side portion (side surface) and a bottom portion (bottom surface) of the trench 203a, so the thickness of the gate oxide film 204 is not uniform. That is, in the high-concentration region 802 doped with impurities, oxidation proceeds at enhanced speeds to form an oxide film thicker than that of both side portions, at the bottom portion of the trench 203a (enhanced oxidation portion 803).

FIG. 9 is a sectional view of a conventional semiconductor device formed with the conventional manufacturing method of FIGS. 8A to 8C. As shown in FIG. 9, the conventional semiconductor device includes, in addition to the components of FIGS. 8A to 8C, a base diffusion layer 209 and a backgate diffusion layer 208 formed on the epitaxial layer 213, and a source diffusion layer 207 formed above the base diffusion layer 209. The base diffusion layer 209 and the source diffusion layer 207 are formed on both sides of the trench 203a, and the backgate diffusion layer 208 is formed outside the layers 207 and 209. A gate electrode 203 is formed inside the trench 203a, and an interlayer insulating film 201 is formed on the gate electrode 203. A source electrode 202 is formed on the source diffusion layer 207, the backgate diffusion layer 208, the base diffusion layer 209, and the interlayer insulating film 201, and a drain electrode 210 is formed below the silicon substrate 211.

In FIG. 9, reference numeral 901 denotes a schematic gate-drain parasitic capacitance (gate capacitance). The gate capacitance of the semiconductor device depends on a dielectric constant between the gate electrode 203 and the drain electrode 210 or a bottom area of the gate electrode 203. In the conventional semiconductor device, the gate oxide film 204 is formed with a large thickness at the bottom of the trench 203a, so a proportion of the gate oxide film 204 to a region between the gate electrode 203 and the drain electrode 210 is larger, so a dielectric constant is lowered to reduce a gate capacitance.

However, the conventional semiconductor device cannot solve the problem that charges are concentrated around the corners of the trench bottom when a large amount of current such as avalanche current flows.

FIG. 10 shows a current path for a large amount of current that flows through the conventional semiconductor device. In FIG. 10, denoted by 1101 are paths where the avalanche current flows. As shown in FIG. 10, in the conventional semiconductor device, when a large amount of current flows, a large amount of charges flowing from the drain electrode 210 to the bottom of the trench 203a tend to flow from the bottom portion of the trench 203a to the side surfaces thereof, so the charges are concentrated around the corners of the bottom of the trench 203a. Therefore, if a large amount of current flows, the gate oxide film would break due to the charge concentration.

Further, in the conventional semiconductor device, when the gate oxide film is formed using the method of FIGS. 8A to 8C, a gate oxide film cannot be formed with sufficient thickness depending on conditions such as manufacturing parameters, and a high-concentration layer remains in some cases.

FIG. 11 shows an example where the enhanced oxidation portion 803 is not sufficiently oxidized, and the high-concentration layer 802 remains in the epitaxial layer 213. In this case, the high-concentration layer 802 remains near the bottom of the trench 203a, and an impurity concentration in this portion is changed. That is, an impurity concentration around the high-concentration layer 802 is higher than the rest of the epitaxial layer 213. As shown in FIG. 11, when a normal drain-source current Ids flows, the current Ids flows around the high-concentration layer 802. Therefore, if the high-concentration layer is not completely oxidized and remains, an operational characteristic (operating voltage or on-resistance) of the semiconductor device (transistor) is affected.

In particular, as shown in FIGS. 8A to 8C, according to the conventional manufacturing method, the thin oxide film at the side portions of the trench and the thick oxide film at the trench bottom are formed through the same step. Hence, it is very difficult to form only the gate oxide film at the trench bottom with a large thickness. For example, in order to further accelerate enhanced oxidation for increasing the thickness of the oxide film at the trench bottom, dosage of an impurity needs to be increased. In this case, as shown in FIG. 11, there is a high possibility that the high-concentration layer remains.

As mentioned above, in the conventional semiconductor device, even though the thickness of the oxide film at the trench bottom increases to reduce a gate capacitance, when a large amount of current such as avalanche current flows, charges are concentrated around the corners of the trench bottom, so the gate oxide film is broken in some cases.

SUMMARY OF THE INVENTION

A semiconductor device according to an aspect of the present invention includes: a first semiconductor layer of a first conductivity type; a channel formation region of a second conductivity type formed on the first semiconductor layer; a trench extending from a surface of the channel formation region to the first semiconductor layer; a gate insulating film covering an inner surface of the trench; a gate electrode filled into the trench; and a buried insulating film formed below the gate electrode apart from the gate insulating film.

According to the semiconductor device, a buried insulating film is formed below a gate electrode away from a gate insulating film, and thus a gate capacitance can be accordingly reduced. If a large amount of current flows, the current flows through side portions of a trench through the buried insulation film, making is possible to prevent charges from concentrating around the corners of the trench bottom, and protect a gate oxide film from breakdown.

A manufacturing method for a semiconductor device according to another aspect of the invention includes: forming a trench in a first semiconductor layer of a first conductivity type; forming a buried insulating film below the trench away from a bottom surface of the trench; forming a gate insulating film to cover an inner surface of the trench; and forming a gate electrode to fill the trench.

According to the manufacturing method, a buried insulating film is formed below a gate electrode away from a gate insulating film, and thus a gate capacitance can be accordingly reduced. If a large amount of current flows, the current flows through side portions of a trench through the buried insulation film, making is possible to prevent charges from concentrating around the corners of the trench bottom, and protect a gate oxide film from breakdown. Further, the buried insulating film and the gate insulating film are separately formed, whereby the buried insulating film can be formed with higher accuracy. In addition, an impurity concentration around the trench or the gate insulating film thickness is not changed, whereby an operational characteristic of the semiconductor device is not affected.

A semiconductor device according to another aspect of the invention includes: a high-concentration semiconductor substrate of a first conductivity type; a low-concentration epitaxial layer of the first conductivity type formed on the high-concentration semiconductor substrate; a low-concentration base diffusion layer of a second conductivity type formed on the low-concentration epitaxial layer; a trench extending from a surface of the low-concentration base diffusion layer to the low-concentration epitaxial layer; a gate insulating film that covers an inner surface of the trench; a gate electrode formed inside the trench through the gate insulating film; a source diffusion layer of the first conductivity type formed with a predetermined width on a surface of the low-concentration base diffusion layer and in contact with the gate insulating film; a high-concentration back-gate diffusion layer of the second conductivity type formed in the low-concentration base diffusion layer outside the source diffusion layer; and a buried insulating film formed in the low-concentration epitaxial layer below the gate electrode and away from the gate insulating film.

According to the semiconductor device, a buried insulating film is formed below a gate electrode away from a gate insulating film, and thus a gate capacitance can be accordingly reduced. If a large amount of current flows, the current flows through side portions of a trench through the buried insulation film, making is possible to prevent charges from concentrating around the corners of the trench bottom, and protect a gate oxide film from breakdown.

According to the present invention, it is possible to provide semiconductor device capable of reducing a gate capacitance, and preventing breakdown of a gate oxide film if a large amount of current flows.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

First, a semiconductor device according to a first embodiment of the present invention is described. The semiconductor device according to this embodiment has a feature that a buried oxide film is formed below a trench (gate electrode) away from a gate oxide film (trench bottom).

Figure 1:
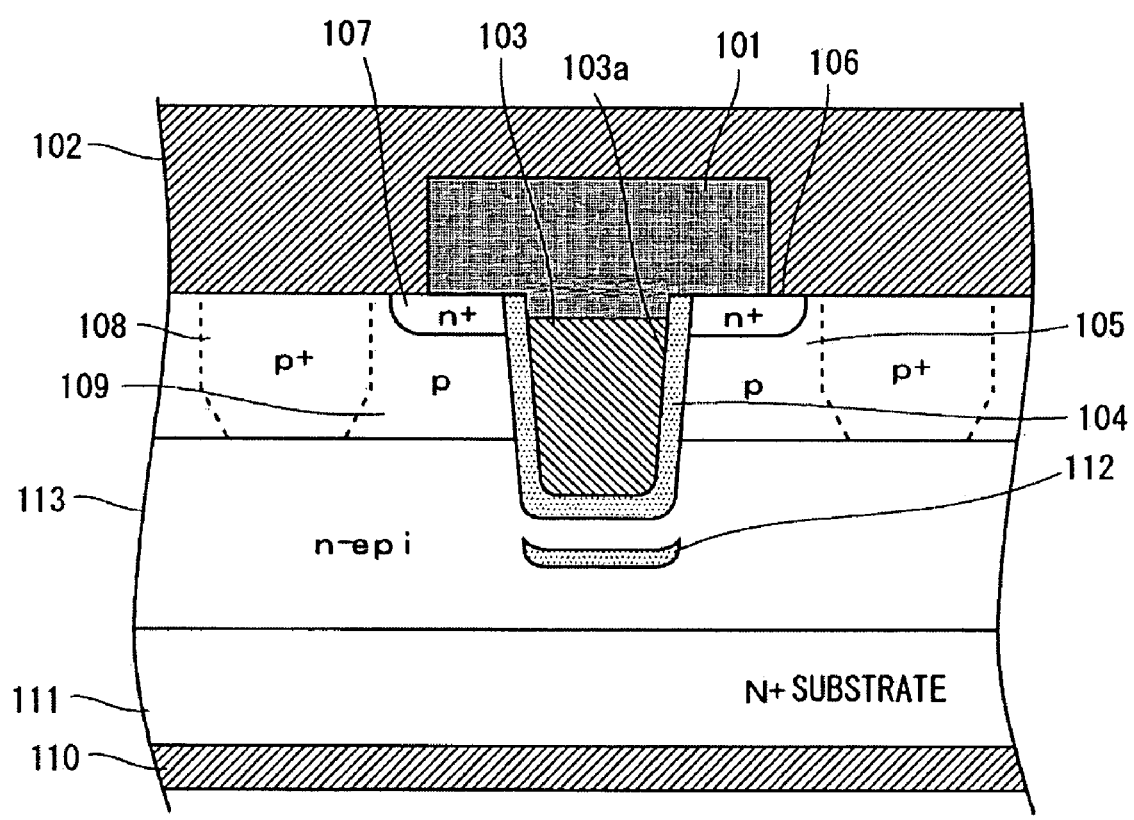
FIG. 1 is a sectional view of a semiconductor device according to a first embodiment of the present invention.

FIG. 1 is a sectional view of the semiconductor device according to this embodiment. This semiconductor device is a high-voltage vertical power MOSFET, in other words, a trench-gate type MOSFET.

As shown in FIG. 1, the semiconductor device includes a silicon substrate 111. The silicon substrate 111 is an n+ type (first conductivity type) semiconductor substrate having a high impurity concentration, for example. An epitaxial layer 113 is formed on the entire surface of the silicon substrate 111. The epitaxial layer 113 is an n− type semiconductor layer having an impurity concentration lower than the silicon substrate 111, for example. The epitaxial layer 113 forms a first semiconductor layer together with the silicon substrate 111 and operates as a drain of the MOSFET.

A base diffusion layer 109 is formed on the epitaxial layer 113. The base diffusion layer 109 is, for example, a p− type (second conductivity type) semiconductor region having a low impurity concentration, and serves as a channel region (channel formation region) 105 where a channel is formed around a gate electrode 103 during the operation of the MOSFET.

A source diffusion layer 107 is formed above the base diffusion layer 109. The source diffusion layer 107 is, for example, n+ type semiconductor region having a high impurity concentration, and serves as a source of the MOSFET. The source diffusion layer 107 is formed in contact with a gate oxide film 104 with a predetermined width.

A backgate diffusion layer 108 is formed outside the source diffusion layer 107 of the base diffusion layer 109 on the silicon substrate 111. The backgate diffusion layer 108 is, for example, a p+ type semiconductor region having a high impurity concentration, and operates as a backgate of the MOSFET.

A trench 103a is formed on the silicon substrate 111, and extends from the surface of the source diffusion layer 107 and the base diffusion layer 109 to the epitaxial layer 113 through the source diffusion layer 107 and the base diffusion layer 109. The gate oxide film (gate insulating film) 104 is formed inside the trench 103a to cover the inner surface of the trench 103a. Further, the gate electrode 103 is filled in the trench 103a. The gate electrode 103 is made of, for example, polysilicon and fills the trench 103a almost up to its opening.

An interlayer insulating film 101 is formed on the gate electrode 103 to cover the opening of the trench 103a and a part of the source diffusion layer 107. Although not shown, a contact hole passes through the interlayer insulating film 101 and leads the gate electrode 103 to the outside.

A source electrode 102 is formed on the source diffusion layer 107, the backgate diffusion layer 108, the base diffusion layer 109, and the interlayer insulating film 101. The source electrode 102 is electrically connected with the source diffusion layer 107 through a source contact 106.

A drain electrode 110 is formed below the silicon substrate 111. The drain electrode 110 is formed on the side (rear side) of the semiconductor device opposite to the side (front side) where the trench 103a is formed.

Further, in this embodiment, a buried oxide film (buried insulating film) 112 is formed below the trench 103a. The buried oxide film 112 is an insulating film similar to the gate oxide film 104. The buried oxide film 112 is formed, for example, in the epitaxial layer 113 below the bottom of the trench 103a away from the gate oxide film 104, not in contact with the gate oxide film. The buried oxide film 112 is an insulating film having a dielectric constant smaller than the epitaxial layer 113. The buried oxide film may be a nitride film as well as an oxide film. For example, the buried oxide film 112 has substantially the same shape as the gate oxide film 104 at the bottom of the trench 103a. In this example, the buried oxide film 112 is formed in the epitaxial layer 113, but may be formed in the silicon substrate 111.

Figure 2A:
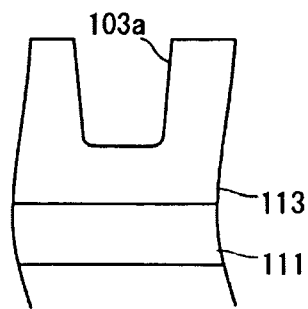
FIGS. 2A to 2E are sectional views for illustrating a manufacturing method for a semiconductor device according to the first embodiment of the present invention.

Referring next to FIGS. 2A to 2E, a manufacturing method for the semiconductor device according to this embodiment is described. As shown in FIG. 2A, the epitaxial layer 113 is first formed on the silicon substrate 111 through the epitaxial growth. Then, plasma etching is selectively carried out from the surface of the epitaxial layer 113 through photolithography to form the trench 103a.

Figure 2B:
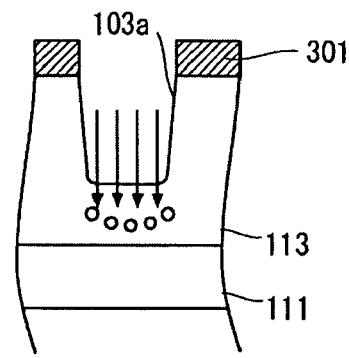

As shown in FIG. 2B, a mask 301 is next formed to expose an opening of the trench 103a, and oxygen ($O_2$) ions are implanted to the bottom of the trench 103a at high dosage and high energy. At this time, the implantation energy is set high enough to inject the oxygen ions up to a predetermined depth with some distance from the bottom of the trench 103a. The higher implantation energy allows the oxygen ions to be implanted more deeply to form the buried oxide film 112 at the larger depth. Further, the thickness (shape) of the thickness of the buried oxide film 112 can be adjusted in accordance with the dosage. The thickness of the buried oxide film 112 can be increased by increasing the dosage. If the dosage at the center of the buried oxide film 112 is increased, the buried oxide film 112 can be formed with a round shape, not a flat shape. For example, if the ions are implanted at the implantation energy of 100 KeV or higher, and the dosage of 1e+18 $cm^{-2}$, oxygen ions can be implanted up to a portion deep below the trench 103a. Incidentally, when a nitride film is used as the buried oxide film 112, nitrogen ions are implanted. Further, the shape of the buried oxide film 112 can be adjusted by controlling the ion implantation direction.

Figure 2C:
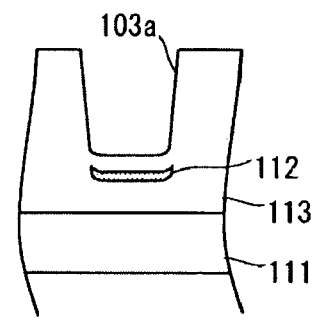

As shown in FIG. 2C, the implanted ions are next heated to form the buried oxide film 112 below the bottom of the trench 103a. For example, heat treatment is carried out in the nitrogen atmosphere under the conditions of the temperature of about 1300 degrees C and a predetermined period. The thickness (shape) of the buried oxide film 112 can be also adjusted by controlling the temperature of the heat treatment. The temperature is increased to further increase the thickness of the buried oxide film 112. That is, the position and shape of the buried oxide film 112 is determined depending on the dosage of ions, the implantation energy, and the temperature of the heat treatment.

In this embodiment, the buried oxide film 112 is formed in a step different from that of the gate oxide film 104 for the purpose of forming the buried oxide film 112 with high accuracy based on manufacturing parameters different from those for the gate oxide film 104. The buried oxide film 112 is desirably formed as early as possible since the buried oxide film is formed through the ion implantation at the large dosage and through high-temperature treatment, so there is a fear that such formation of the buried oxide film affects the gate oxide film 104 and other diffusion layers.

Figure 2D:
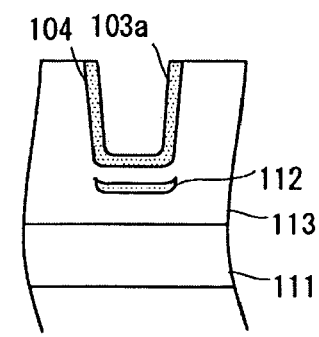
Figure 8A:
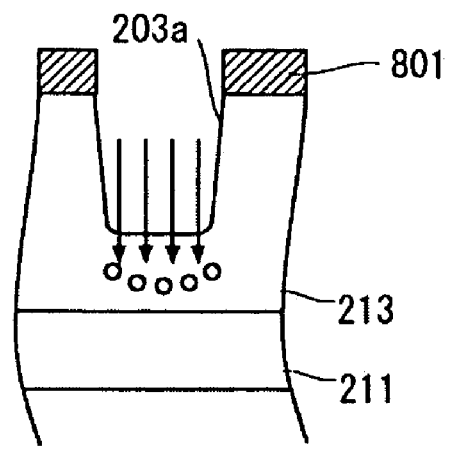
FIGS. 8A to 8C are sectional views for illustrating a manufacturing method for a conventional semiconductor device.
Figure 8B:
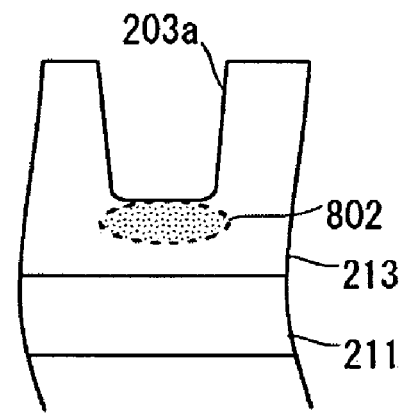
Figure 8C:
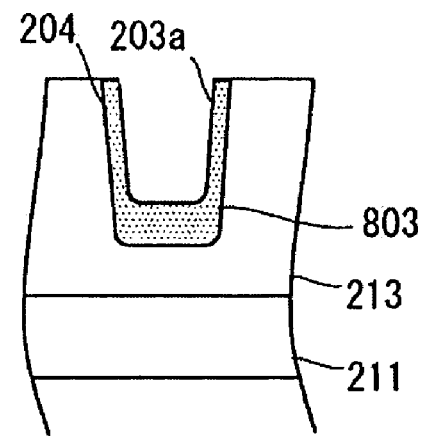

As shown in FIG. 2D, the gate oxide film 104 is next formed inside the trench 103a through thermal oxidation. For example, the thermal oxidation is carried out in the oxygen atmosphere under the conditions of the temperature of about 1000 degrees C. and a predetermined period. In this embodiment, unlike the conventional example of FIGS. 8A to 8C, the impurity concentration at the side portions of the trench 103a is the same as that at the bottom thereof. Hence, substantially the uniform gate oxide film 104 is formed on the entire inner portion of the trench 103a.

Figure 2E:
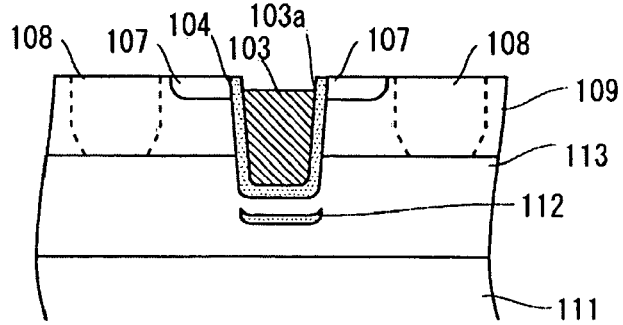

As shown in FIG. 2E, the gate electrode 103 is next formed inside the trench 203a. For example, polysilicon is deposited on the epitaxial layer 113 and inside the trench 103a through CVD. A high-concentration impurity such as phosphorous is injected into the polysilicon, followed by heat treatment at high temperature. After that, unnecessary polysilicon is etched back to selectively leave polysilicon only in the inner portion of the trench 103a to form the gate electrode 103.

Then, the base diffusion layer 109 is formed on the epitaxial layer 113, after which the source diffusion layer 107 and the backgate diffusion layer 108 are formed. Each diffusion layer is formed by masking a desired region through the photolithography, injecting impurities, and executing the heat treatment. For example, the diffusion layers are formed in such an order that the layer requiring the impurity injection with a higher concentration and the heat treatment at higher temperature is first formed.

After that, the interlayer insulating film 101, the source electrode 102, and the drain electrode 110 are formed to complete the semiconductor device of FIG. 1.

Figure 3:
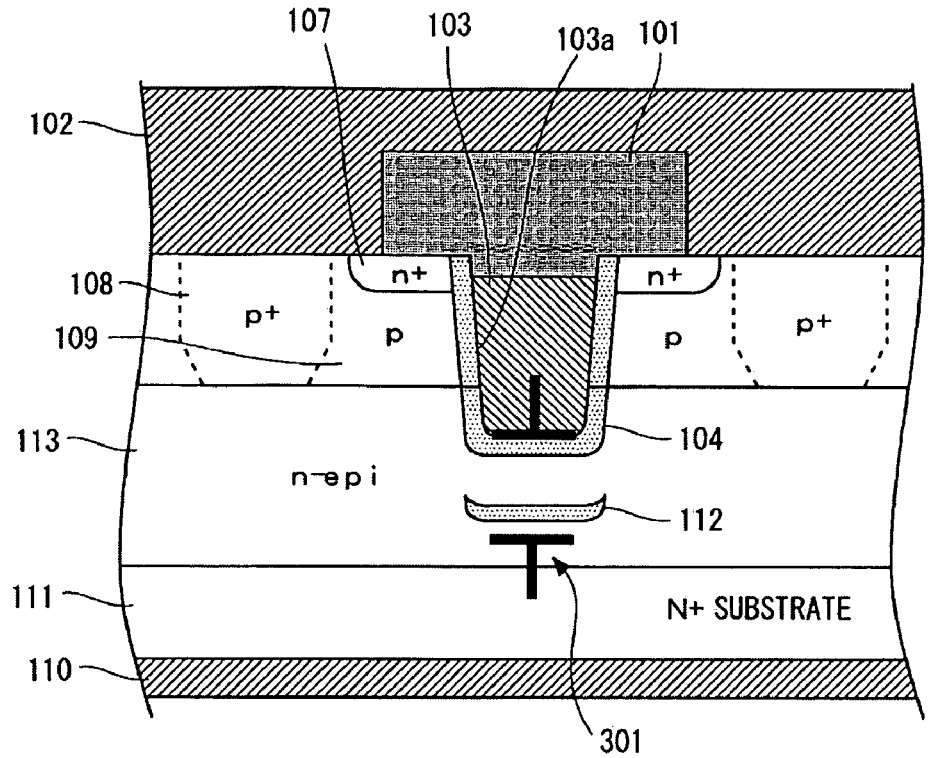
FIG. 3 is a sectional view for illustrating a parasitic capacitance of the semiconductor device according to the first embodiment of the present invention.
Figure 9:
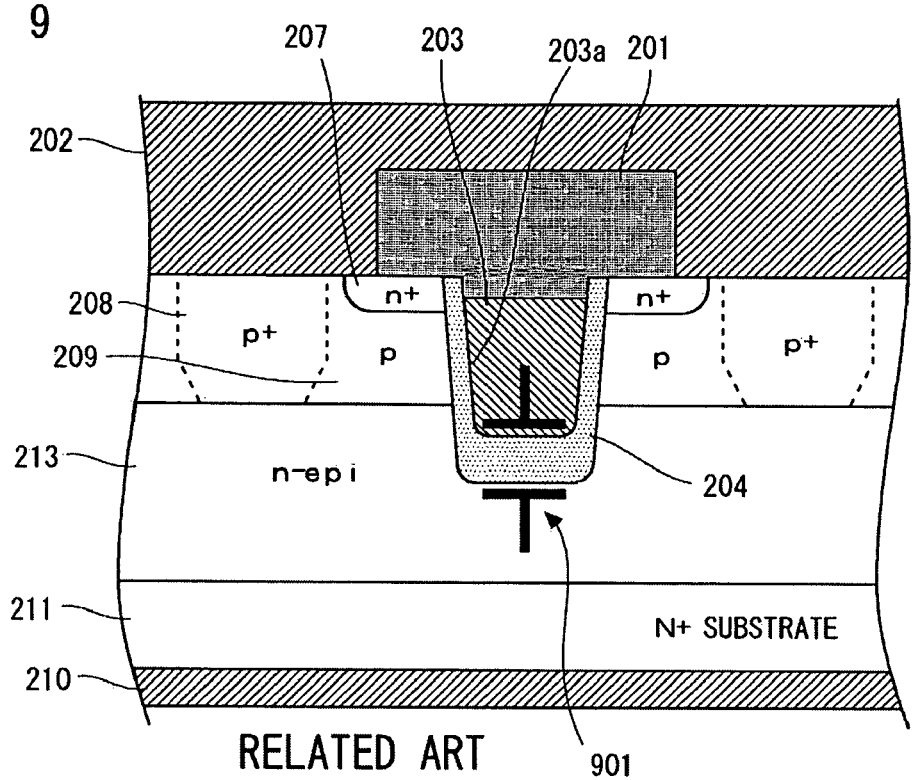
FIG. 9 is a sectional view for illustrating a parasitic capacitance of the conventional semiconductor device.
Figure 10:
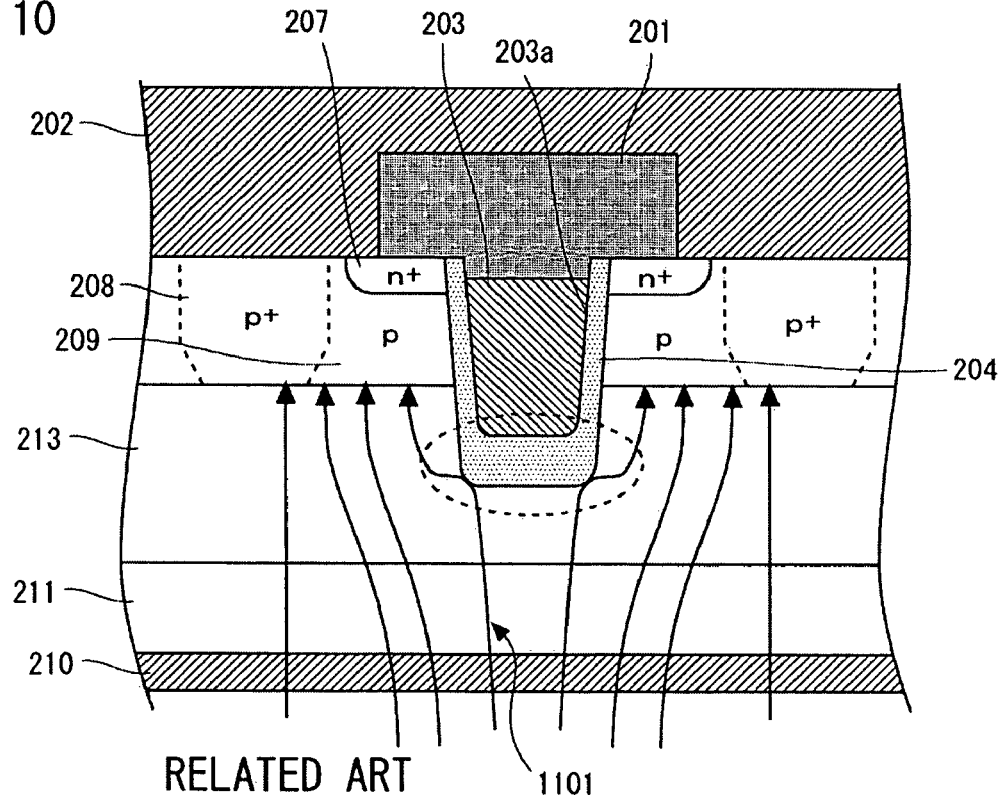
FIG. 10 is a sectional view for illustrating a path of a large amount of current that flows through the conventional semiconductor device.

Next, the operational characteristic of the semiconductor device according to this embodiment is described. FIG. 3 schematically shows a gate-drain parasitic capacitance (gate capacitance) of the semiconductor device according to this embodiment. In FIG. 3, denoted by 301 is a gate capacitance. The gate capacitance of the semiconductor device varies depending on the dielectric constant between the gate electrode 103 and the drain electrode 110 and a bottom surface area of the gate electrode 103. In this semiconductor device, the buried oxide film 112 is formed below the gate electrode 103, so the dielectric constant is lowered in proportion to the proportion (thickness) of the buried oxide film 112 to the region between the gate electrode 103 and the drain electrode 110 to suppress the gate capacitance. For example, if the buried oxide film 112 is formed with larger thickness, the gate capacitance can be reduced more than the conventional example of FIG. 9.

Figure 4:
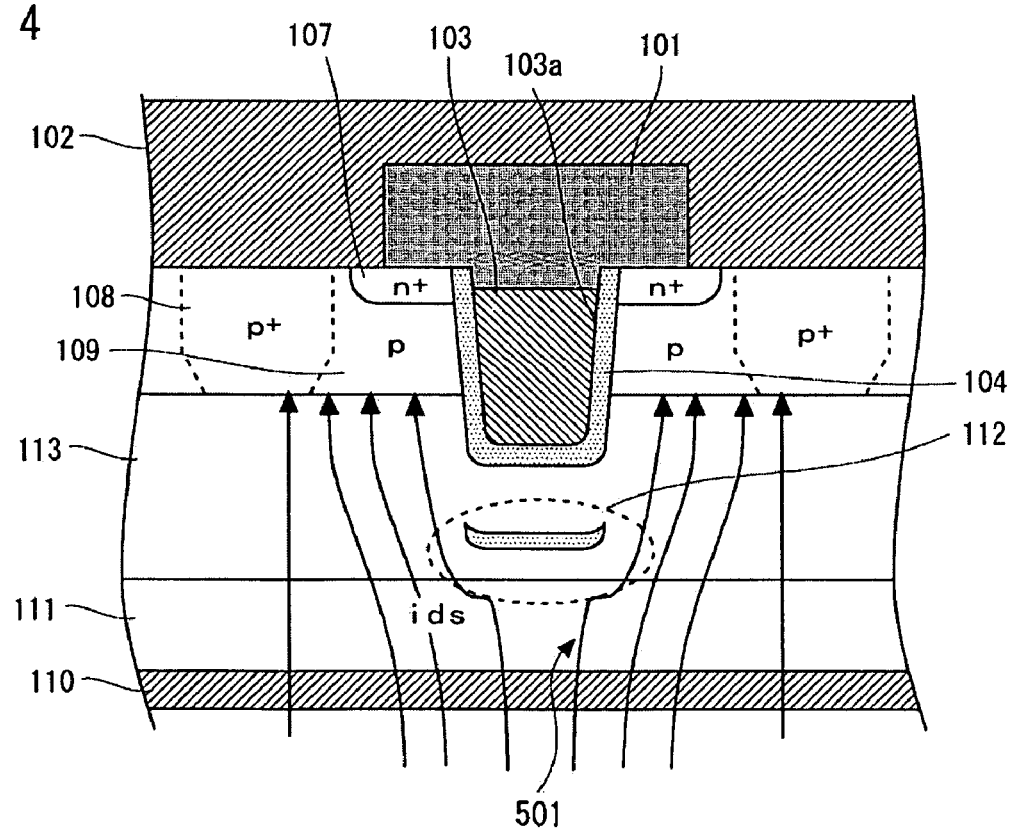
FIG. 4 is a sectional view for illustrating a path of a large amount of current that flows through the semiconductor device according to the first embodiment of the present invention.

FIG. 4 shows a current path for a large amount of current that flows through the semiconductor device according to this embodiment. In FIG. 4, denoted by 501 is a path for avalanche current. As shown in FIG. 4, in the semiconductor device, when a large amount of current flows, charges directed from the drain electrode 110 to the bottom of the trench 103a do not flow to the bottom of the trench 103a but flow from the bottom (rear side) of the buried oxide film 112 to the side portions of the trench 103a. That is, the buried oxide film 112 functions to prevent the charges from flowing to the bottom of the trench 103a. Thus, charge concentration on the corners of the bottom of the trench 103a is avoided to prevent the breakage of the gate oxide film at the bottom of the trench 103a. Therefore, as the shape of the buried oxide film 112, it is desirable to form the buried oxide film 112 with such a shape as to cover the bottom of the gate electrode 103 or with almost the same shape as the gate oxide film 104 that covers the bottom of the trench 103a, particularly preferably, with a size enough to reach the gate oxide film 104 at the corners of the bottom of the gate electrode 103, in order to prevent current from flowing to the bottom of the gate electrode 103.

Figure 5:
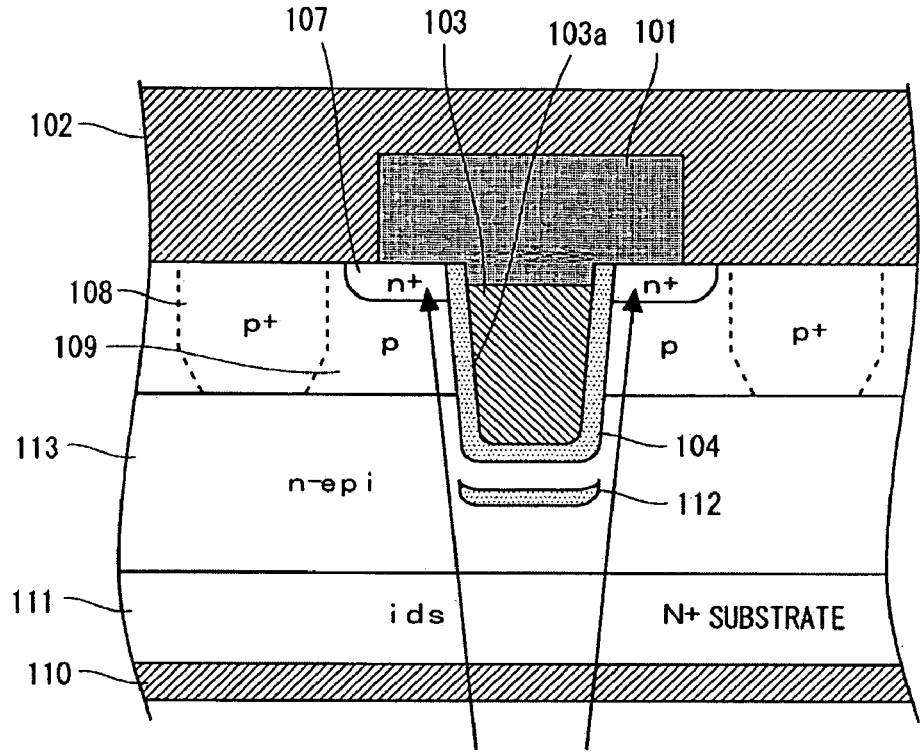
FIG. 5 is a sectional view for illustrating a path of normal current that flows through the semiconductor device according to the first embodiment of the present invention.
Figure 11:
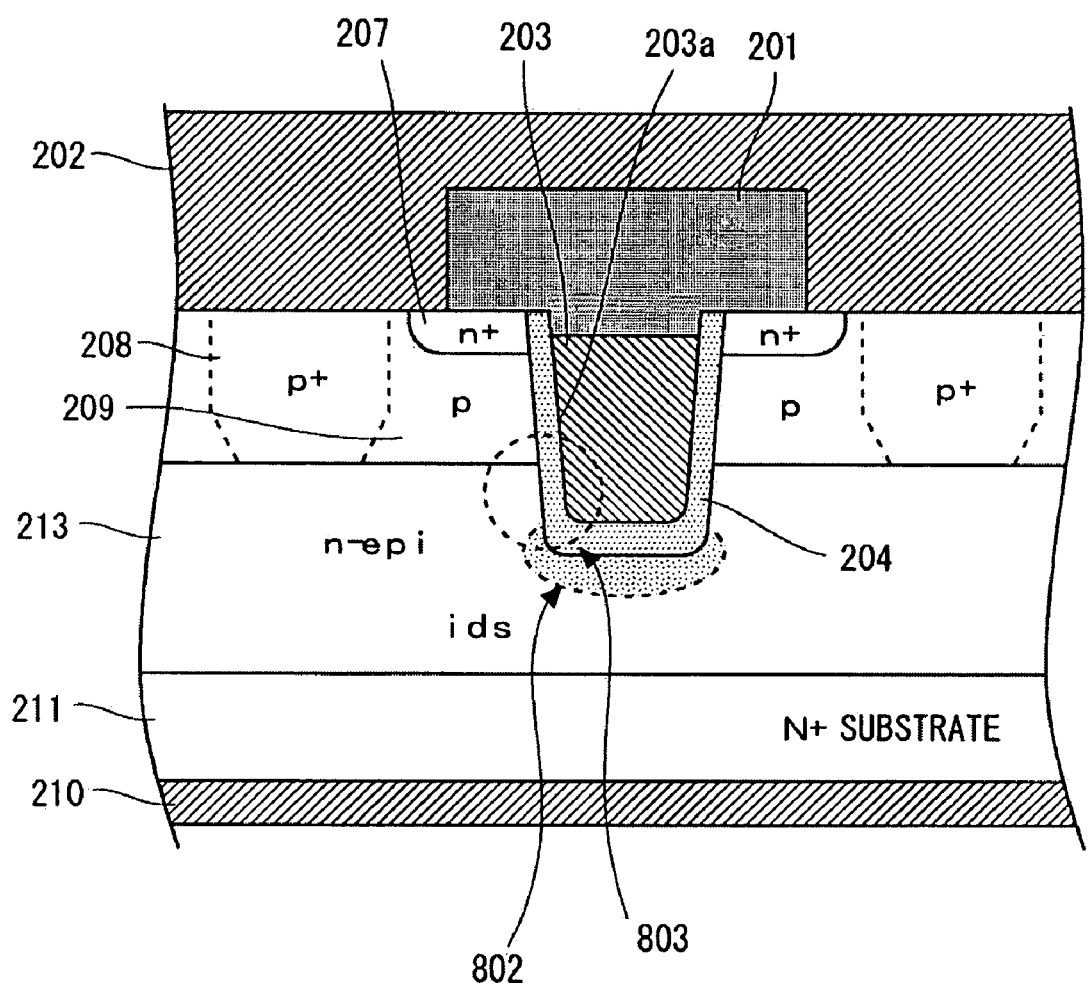
FIG. 11 is a sectional view for illustrating a path of normal current that flows through the conventional semiconductor device.

FIG. 5 shows a current path for normal current that flows through the semiconductor device according to this embodiment. As shown in FIG. 5, at normal times, a drain-source current Ids flows substantially linearly from the drain electrode 110 to the source diffusion layer 107. That is, in this embodiment, as shown in FIGS. 2A to 2E, the buried oxide film and the gate oxide film are separately formed. Hence, unlike the conventional example of FIG. 11, a high-concentration layer is not formed around the trench. Thus, current flows linearly with no influence, not around the high-concentration layer near the trench, and thus, an influence on the operational characteristic of the semiconductor device (transistor) can be suppressed. Accordingly, as a desirable shape of the buried oxide film 112, the film has an outer shape along the side portions of the trench 103a, that is, end portions of the buried oxide film 112 are extensions of the gate oxide film 104 that covers the side portions of the trench 103a, in order not to affect a current path. Further, the buried oxide film 112 may be formed with such a shape as to rectify current and allow current to more efficiently flow. For example, the buried oxide film 112 may be formed with the triangular or curved bottom shape, for example, so as to make the central portion of the buried oxide film 112 closer to the drain electrode 110.

As mentioned above, in this embodiment, in the trench-gate type MOSFET, the buried oxide film is formed below the bottom of the gate electrode away from the gate oxide film, which enables reduction in a gate capacitance between the gate and the drain; the reduction corresponds to the buried oxide film and the silicon substrate. Further, if the avalanche current flows between the drain and the source, the buried oxide film below the gate bottom rectifies the current. Hence, charges are hardly concentrated on the corners of the gate bottom, and the gate oxide film can be prevented from breaking. Further, in this embodiment, the buried oxide film and the gate oxide film are separately formed, so an impurity concentration around the trench gate and a gate oxide film thickness are uniform unlike the case of forming no buried oxide film. Accordingly, the buried oxide film can be formed without changing the trench-gate forming step. The uniform impurity concentration never affects the current path, so an influence of the formed buried oxide film on the operational characteristic of the semiconductor device can be suppressed.

Second Embodiment

Next, a semiconductor device according to a second embodiment of the present invention is described. The semiconductor device according to this embodiment has a feature that the number of buried oxide films as described in the first embodiment is increased.

Figure 6:
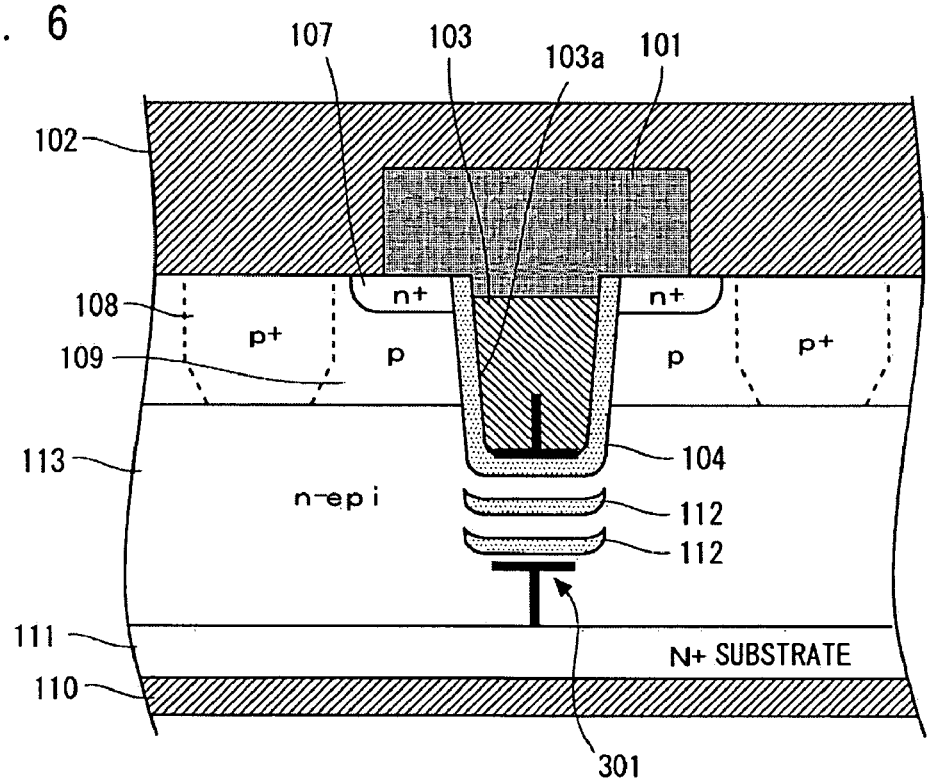
FIG. 6 is a sectional view of a semiconductor device according to a second embodiment of the present invention.

FIG. 6 is a sectional view of the semiconductor device according to this embodiment. In FIG. 6, the same components as those of FIG. 1 are denoted by like reference numerals, and their description is omitted if not necessary. As shown in FIG. 6, the semiconductor device includes two buried oxide films 112 as compared with the structure of FIG. 1. In this example, the two buried oxide films 112 are arranged away from each other in parallel. As denoted by 301 of FIG. 6, the provision of the two buried oxide films 112 increases a proportion of the buried oxide film 112 to a region between the gate electrode 103 and the drain electrode 110. Thus, a gate capacitance can be made smaller than the first embodiment. For example, any more buried oxide films 112 may be formed to further reduce the gate capacitance.

The manufacturing method is the same as that of FIGS. 2A to 2C. For example, in FIG. 2B, oxygen ions are implanted twice at difference implantation energy levels. The first implantation is carried out at higher energy level than the first embodiment, and the second implantation is carried out at the same energy level as the first embodiment. The implantation energy level of the oxygen ions is switched to form the buried oxide film 112 at multiple stages. After the implantation of the oxygen ions, in FIG. 2C, the two buried oxide films 112 are formed at a time through one heat treatment. At this time, the heat treatment may be carried out in two steps. For example, if the two buried oxide films 112 differ in thickness or size, the two buried oxide films 112 are preferably formed through heat treatment with different temperatures and periods in order to form the films with accuracy.

Figure 7:
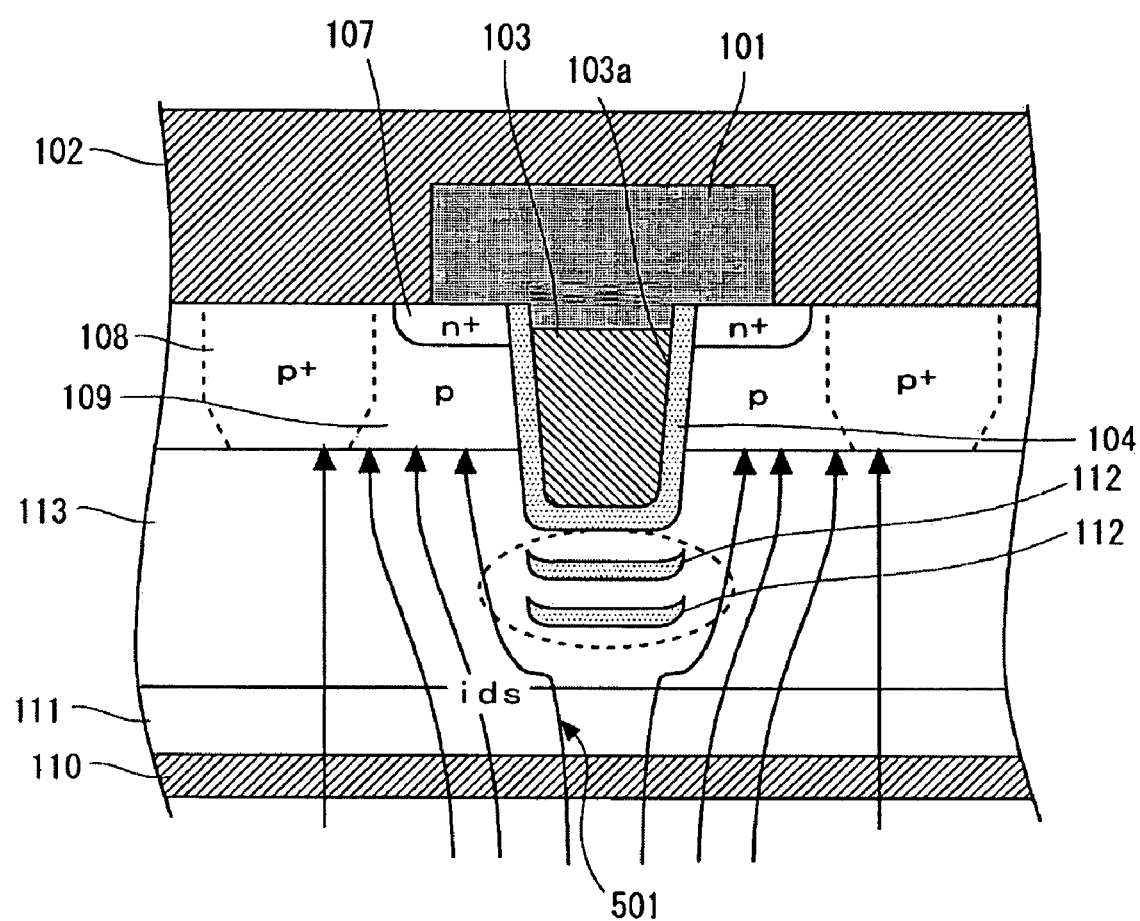
FIG. 7 is a sectional view for illustrating a path of a large amount of current that flows through the semiconductor device according to the second embodiment of the present invention.

FIG. 7 shows a current path for a large amount of current that flows through the semiconductor device according to this embodiment. In FIG. 7, denoted by 501 is a path for avalanche current. As shown in FIG. 7, in the semiconductor device, the two buried oxide films 112 prevent current from flowing to the bottom of the gate electrode 103 to effectively avoid the breakage of the gate oxide films. For example, even if a large amount of current breaks the buried oxide film 112 on the drain electrode 110 side, the buried oxide film 112 on the gate electrode 103 side can prevent current from flowing to the bottom of the gate electrode 103. Further, the two buried oxide films 112 facilitate the current flow from the bottom of the buried oxide film 112 to the side portions of the trench 103a. The current can be more rectified to suppress an influence on the operational characteristic. In this example, the two buried oxide films 112 have the same shape, but may have different shapes for enhancing a current rectifying effect. For example, the buried oxide film 112 on the drain electrode 110 side may be made smaller than the rest.

As set forth above, in this embodiment, the plural buried oxide films are formed to reduce a gate capacitance more than the first embodiment, effectively prevent the breakage of the gate oxide film, and suppress an influence of an operational characteristic of the semiconductor layer.

The conductivity type of each semiconductor layer can be changed to prepare MOSFETS of different polarities. It is apparent that the present invention is not limited to the above embodiment that may be modified and changed without departing from the scope and spirit of the invention.

What is claimed is:

1. A semiconductor device, comprising:
   a first semiconductor layer of a first conductivity type;
   a channel formation region of a second conductivity type formed in the first semiconductor layer;
   a trench extending from a surface of the channel formation region to the first semiconductor layer;
   a gate insulating film formed on an inner surface of the trench;
   a gate electrode formed in the trench, the gate electrode having a bottom surface; and
   a buried insulating film formed below the bottom surface of the gate electrode apart from the gate insulating film,
   wherein the buried insulating film is buried within the first semiconductor layer in an area beneath the trench excluding an area beneath the channel formation region.

2. The semiconductor device according to claim 1, wherein the buried insulating film has a dielectric constant smaller than a dielectric constant of the first semiconductor layer.

3. The semiconductor device according to claim 1, wherein the buried insulating film covers a bottom surface of the gate electrode.

4. The semiconductor device according to claim 1, wherein the buried insulating film has substantially the same shape as the gate insulating film covering a bottom surface of the trench.

5. The semiconductor device according to claim 1, wherein an end of the buried insulating film is an extension of the gate insulating film that covers side surfaces of the trench.

6. The semiconductor device according to claim 1, wherein the buried insulating film includes a plurality of insulating films that are formed separately and spaced apart from one another.

7. The semiconductor device according to claim 1, wherein the first semiconductor layer includes a semiconductor substrate and an epitaxial layer formed on the semiconductor substrate, and
   the plurality of buried insulating films are buried in the epitaxial layer.

8. The semiconductor device according to claim 1, further comprising:
   a source diffusion region of the first conductivity type formed in the channel formation region; and
   a backgate diffusion region of the second conductivity type formed in the channel diffusion region, the backgate diffusion region having higher impurity concentration than that of the channel diffusion region.

9. The semiconductor device according to claim 1, wherein the first semiconductor layer includes a semiconductor substrate and an epitaxial layer formed on the semiconductor substrate, and
   the buried insulating film is buried in the semiconductor substrate.

10. The semiconductor device according to claim 1, wherein the first semiconductor layer includes a semiconductor substrate and an epitaxial layer formed on the semiconductor substrate, and
    the buried insulating film is buried in at least one of the semiconductor substrate and the epitaxial layer.

11. The semiconductor device according to claim 1, wherein each of the plurality of insulating films is formed entirely below the bottom surface of each gate electrode.

12. The semiconductor device according to claim 1, wherein the buried insulating film is completely surrounded by the first semiconductor layer.

* * * * *